(12) United States Patent
Huang

(10) Patent No.: US 6,853,602 B2
(45) Date of Patent: Feb. 8, 2005

(54) HIDING ERROR DETECTING/CORRECTING LATENCY IN DYNAMIC RANDOM ACCESS MEMORY (DRAM)

(75) Inventor: Chien-Hua Huang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 10/434,624

(22) Filed: May 9, 2003

(65) Prior Publication Data

US 2004/0223395 A1 Nov. 11, 2004

(51) Int. Cl.[7] .................................................. G11C 7/00
(52) U.S. Cl. .................................. 365/222; 365/189.04
(58) Field of Search ................................ 365/222, 236, 365/200, 189.04, 189.01

(56) References Cited

U.S. PATENT DOCUMENTS 6,560,725 B1 * 5/2003 Longwell et al. ............. 714/54

* cited by examiner

Primary Examiner—Thong Q. Le
(74) Attorney, Agent, or Firm—Slater & Matsil, L.L.P.

(57) ABSTRACT

System and method for hiding error detecting and correcting latency in a dynamic random access memory refresh cycle. A preferred embodiment comprises in a first memory refresh cycle, detecting the presence of an error in information retrieved from a memory element and in a second memory refresh cycle, writing corrected information back to the memory element containing the erroneous information, wherein the second memory refresh cycle is a memory refresh cycle immediately following the first memory refresh cycle.

23 Claims, 7 Drawing Sheets

HIDING ERROR DETECTING/CORRECTING LATENCY IN DYNAMIC RANDOM ACCESS MEMORY (DRAM)

TECHNICAL FIELD

The present invention relates generally to semiconductor memories, and more particularly to a system and method for hiding latency involved with error detecting and correcting in dynamic random access memory.

BACKGROUND

The use of solid-state memory in computers and electronic devices has become widespread. Technological improvements have made it possible to continually increase the amount of memory, particularly dynamic random access memory (DRAM), in these devices. The increased memory helps to improve the usefulness of these devices, by making them faster (by replacing slower physical (magnetic) memory with faster solid-state memory), use less power (solid-state memory tends to consume less power than the mechanical devices used in magnetic memory), and more powerful (increased memory permits larger applications to be run on the devices.

However, as memories get larger and larger, the probability of an error occurring within the memory increases. Errors in a memory may be classified into two categories: hard and soft. Hard errors may be the result of defects in the actual physical structure of the memory, such as a faulty capacitor or transistor. Soft errors on the other hand may be the result of glitches induced by error sources such as alpha particles, gamma rays, radiation, electrical noise, and so forth. Soft error may be thought of as being transient in nature.

There are several different ways to detect and correct errors. A first method involves the use of a parity bit per group of memory bits. For example, a single parity bit may be used to cover an eight-bit group (a byte) of memory values. One way to use the parity bit is to perform a count of the number of bits in the byte with values equal to one. Then, if the count is an odd number, the parity bit may be set to one and if the count is even, the parity bit may be set to zero. Parity bits however, can only be used to detect the presence of an error, they cannot correct errors.

More sophisticated methods are available that can detect and correct errors. These methods typically use more than one bit per group of memory bits that they are protecting and involve a two-step process wherein an error is first detected and then the error is corrected. For example, a natural place to detect and correct errors in memory is when information is read from a memory location. When the information is read from the memory location, error detecting hardware can be used to determine if an error has occurred. If an error has occurred, then there are generally two places where the error needs to be fixed: the memory location itself and the information read from the memory location. The information as read from the memory location can be readily corrected (in many instances, the circuitry that detected the error can automatically correct the error); however, correcting the contents of the actual memory location requires that the corrected information be written back to the memory location.

A commonly used technique involves immediately writing the corrected information back to the memory location. This technique uses additional time inserted into the memory read cycle to write the corrected information back to the memory location. It has an advantage in that the corrected information is immediately written back as soon as an error has been detected. This can prevent consistency problems that may arise when the information is corrected at one location (the storage location) and not at another (the memory location).

Another commonly used technique involves the use of idle cycles in the memory access period to write the corrected information back to the memory location. This has an advantage in that the read cycles do not need to be extended to support the write operation.

One disadvantage of the prior art is that the insertion of additional time in the read cycle to support the write operation lengthens the duration of the read cycle. This hurts performance in general since for the majority of the read cycles, the extra time is wasted since an error does not need to be corrected. This results in a slow down in row access time or random access speed.

A second disadvantage of the prior art is that the wait for an idle cycle may be a wait for an event that does not come for a long time. If the memory location or a memory bank containing the memory location is continually accessed, the wait for an idle cycle may be an extended wait. This extended wait may cause consistency problems, especially if an additional error is detected prior to the correction of the previous error.

A third disadvantage of the prior art is that the error detection performed during a read cycle only detects errors in memory locations that are read. If a memory location is not read, then no error detection occurs for that particular memory location. Therefore, large sections of the memory space may not be checked. With memory locations going unchecked, errors may accumulate (perhaps due to soft errors) to a point where the error detecting/correcting mechanism can no long detect and/or correct the errors.

SUMMARY OF THE INVENTION

These and other problems are generally solved or circumvented, and technical advantages are generally achieved, by preferred embodiments of the present invention which provides for a system and method for hiding error detecting/correcting latency in dynamic random access memory.

In accordance with a preferred embodiment of the present invention, a method for hiding error detecting and correcting latency comprising in a first memory refresh cycle, determining if an error exists in information stored in a memory element being refreshed, and in a second memory refresh cycle, writing corrected information to the memory element if the information contains an error.

In accordance with another preferred embodiment of the present invention, a memory system comprising a memory array containing a plurality of memory elements, an error correcting circuit coupled to the memory array, the error correcting circuit containing circuitry to detect and correct errors in information stored in the memory array, a refresh controller coupled to the error correcting circuit, the refresh controller containing circuitry to generate memory addresses for memory refresh cycles, and a read/write mode register coupled to the error correcting circuit, the read/write register specifies an operating mode of the memory system.

In accordance with another preferred embodiment of the present invention, a method of hiding error detecting and correcting latency in a memory comprising in a first memory refresh cycle, sensing information stored in a memory element, determining if the information contains errors, setting a control value to a specified value if the information contains errors, correcting the information, in a second memory refresh cycle, writing the corrected information back to the memory element if the control value is equal to the specified value, and performing the sensing, determining, setting, and correcting if the control value is different from the specified value.

An advantage of a preferred embodiment of the present invention is by hiding error detect and correct latency in a refresh cycle, performance is not degraded by requiring techniques such as read cycle lengthening or idle cycle insertions.

A further advantage of a preferred embodiment of the present invention is each memory location within a memory array is ensured of being tested for errors. This can prevent an accumulation of errors.

Yet another advantage of a preferred embodiment of the present invention is that the memory locations will be tested regardless of the amount and number of accesses made to the memory, meaning that if the electronic device is idle and is not reading and writing to memory, the detecting and correcting of any errors present in memory will proceed as normal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a specific type of random access memory referred to as dynamic random access memory (RAM). The invention may also be applied, however, to other types of memories requiring periodic refreshes of information stored in the memory such as fast page mode dynamic RAM, extended data-out dynamic RAM, synchronous dynamic RAM, double data rate synchronous dynamic RAM, embedded DRAM, IT-SRAM, and so forth.

Figure 1:
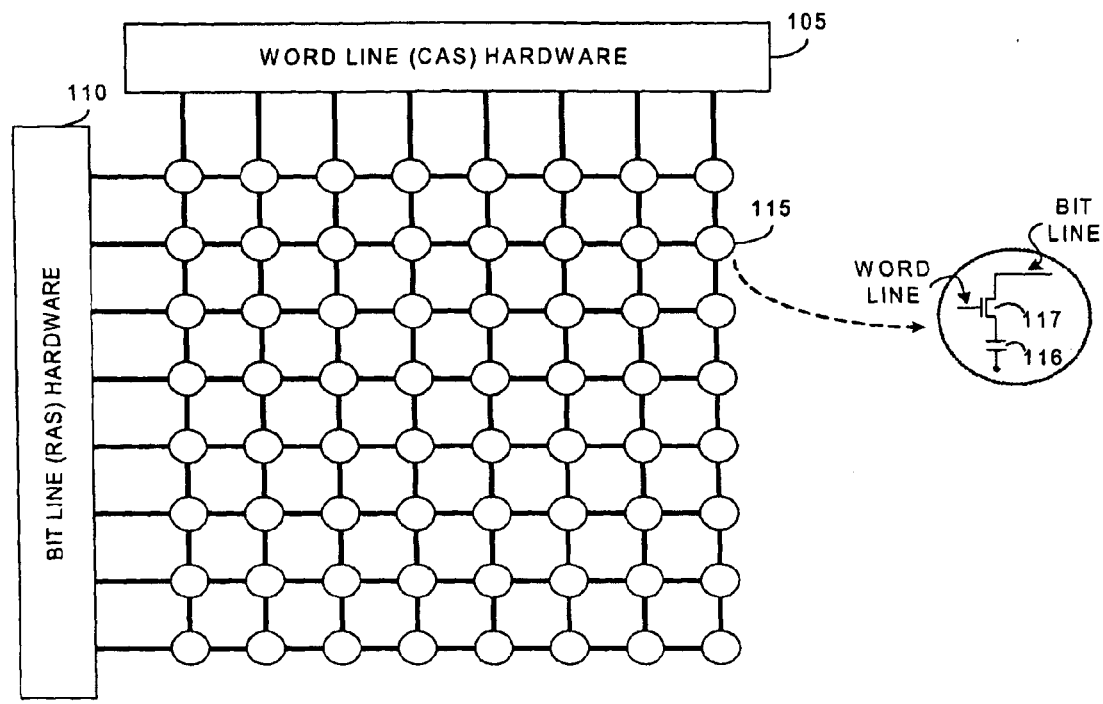
FIG. 1 is a diagram of an exemplary structure of a random access memory.

With reference now to FIG. 1, there is shown a diagram illustrating a view of an exemplary structure of a random access memory (RAM). The RAM, as shown in FIG. 1, has a set of word line hardware 105 and bit line hardware 110. The word line hardware 105 may include voltage and current sources (used in the reading/writing/refreshing operations), while the bit line hardware 110 may include sense amplifiers (used to detect and place charge stored in the memory elements themselves), and so forth. In dynamic RAM, or DRAM, a memory element (for example, memory element 115) typically includes a capacitor 116 to store a charge that represents a single bit of information. For example, if the capacitor 116 is full (or near full) of charge, then it may be holding a binary one and if the capacitor 116 is empty (or near empty) of charge, then it may be holding a binary zero. A transistor 117, with its gate coupled to a word line, may operate at a switch to permit detecting (reading) and placing (writing) a charge stored on the capacitor 116.

To access the DRAM memory element 115, the transistor 117 is turned on by the word line. A charge, Cs, stored on the capacitor 116 becomes distributed on the bit line and creates a voltage difference of $\Delta VB$ between Cs and a reference voltage, VDD/2, which was the initial value of the bit line. A sense amplifier (not shown) having a first input coupled to the bit line and a second input coupled to a reference voltage, VDD/2, can be used to determine the information stored in the capacitor 116 by detecting the voltage difference on the bit line when compared to the reference voltage, VDD/2.

Unfortunately, any access to the charge, Cs, stored on the capacitor 116 will also destroy the information represented by the charge by changing the value of the charge. Therefore, the value of the charge needs to be recovered in a row cycle of a complete memory access cycle. During the row cycle, the data to be recovered is amplified by a sense amplifier (not shown) coupled to the bit line and the capacitor 116 will be charged to VDD (representing a logic "1") or discharged to substrate ground (representing a logic "0").

The charge stored in the capacitor 116 has a tendency to discharge over time. Therefore, if not accessed for an extended period of time, the charge (and hence the information) stored in the capacitor 116 may be lost. Therefore, each memory element in a DRAM needs to be periodically refreshed. A refresh operation typically will comprise activating a word line (to turn on the transistor 117), sensing the charge stored on the capacitor 116, and placing a charge on the capacitor 116 corresponding to the sensed logical value on the capacitor (either a voltage equal to VDD or substrate ground).

Figure 2:
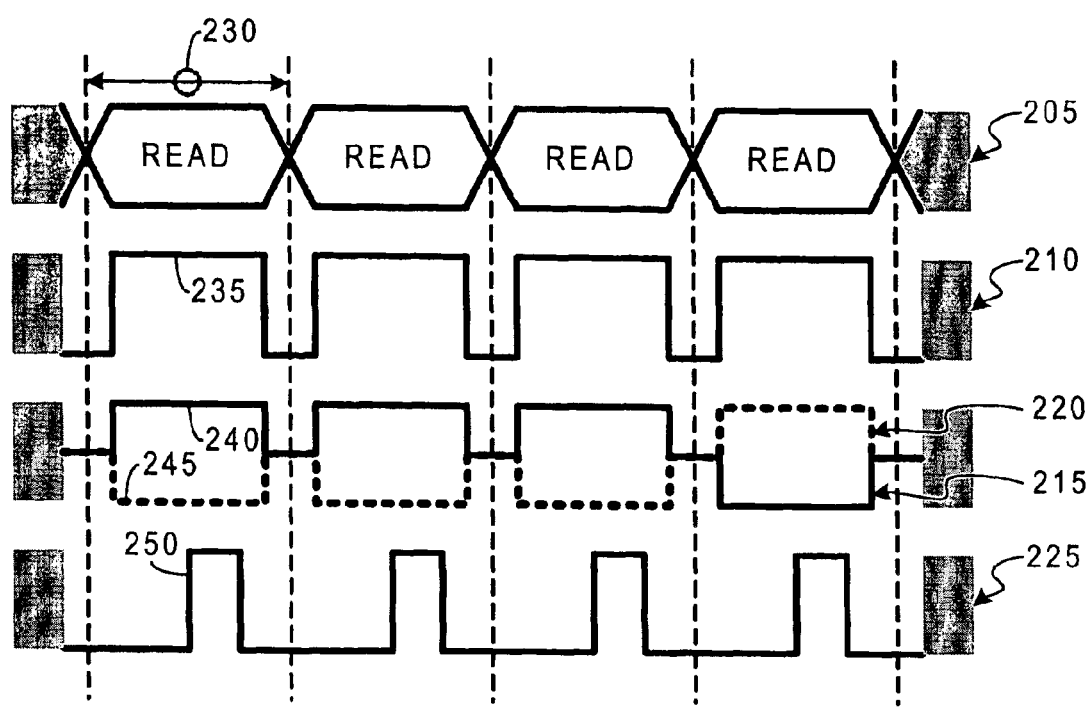
FIG. 2 is a timing diagram of several memory read cycles for a dynamic random access memory (DRAM)

With reference now to FIG. 2, there is shown a timing diagram illustrating a sequence of several read cycles for a DRAM, including waveforms of various signals used during the read operation. A first timing trace 205 represents the operation performed on the DRAM, with possible operations including but not necessarily limited to read, write, refresh, and idle. A second timing trace 210 represents the signal on a word line. A third and fourth timing traces 215 and 220 represent a signal on a bit line (timing trace 215, solid line) and an inverse bit line (timing trace 220, dashed line). The bit line and inverse bit line are the other two conductors being used to access a memory element. The bit and inverse bit lines are the two components of a differential mode signal used to detect (and write) the charge stored in a capacitor in a memory element. Note that the value of bit and inverse bit lines can vary depending on the value in the capacitor. For example, if the bit line develops into a binary zero (and hence the inverse bit line develops into a binary one), then the value in the capacitor was a binary zero and if the bit line develops into a binary one, then the value in the capacitor was a binary one. A fifth timing trace 225 represents a signal on a column select line. Some memories are organized so that a single access can read, write, or refresh an entire memory unit at one time. A memory unit may be thought of as a logical grouping of memory elements.

Note that in the discussion below, reference may be made to reading information from a memory element. It should be understood that the memory element may, in fact, contain multiple bits of information. A single memory element, in the context of the discussion, may include multiple individual storage devices capable of storing a plurality of bits of information. In the discussion below, a reference to a memory element may mean a single memory element (one bit) or an entire memory unit (a logical grouping of bits, such as a byte or a word).

A read access to a memory element may be as follows. At the beginning of a read access, the word line for the particular memory element becomes active (displayed as a pulse on the second timing trace 210). Prior to use, a charge of about VDD/2 is developed on both the bit line and the inversed bit line. After the word line becomes active, the bit line for the particular memory element becomes active (displayed as a pulse on the third timing trace 215). The fourth timing trace 220 also becomes active in a complementary fashion with respect to the bit line. With the word and bit lines for the memory element being active, it is possible to access the information stored in the memory element. Finally, the column select line (sometimes referred to as an access enable line) becomes active (displayed as pulse 250 on the fifth timing trace 225). As stated previously, the column select line can be use to permit access to all of the memory elements in a memory unit. With the column select line becoming active, the information contained in the memory element(s) can be read out.

Error detecting and correcting can take place after the information stored in a memory element has been read from the memory. The information read from the memory may consist of a message portion (the actual data) plus one or more checking bits that are used in the error detection and correction. This information may be provided to an error detection and correction unit wherein the information (including the message part and checking part) is provided to error detection and correction unit for diagnosing the error pattern and fixing the error bits. If an error is detected, then there are two places where the error must be corrected. A first place that requires the correction of the error is the memory location itself and a second place is the information as read from the memory location. Note however that many implementations of error detecting and correcting circuitry automatically correct detected errors, so the information as read from the memory location is normally not a concern.

Figure 3:
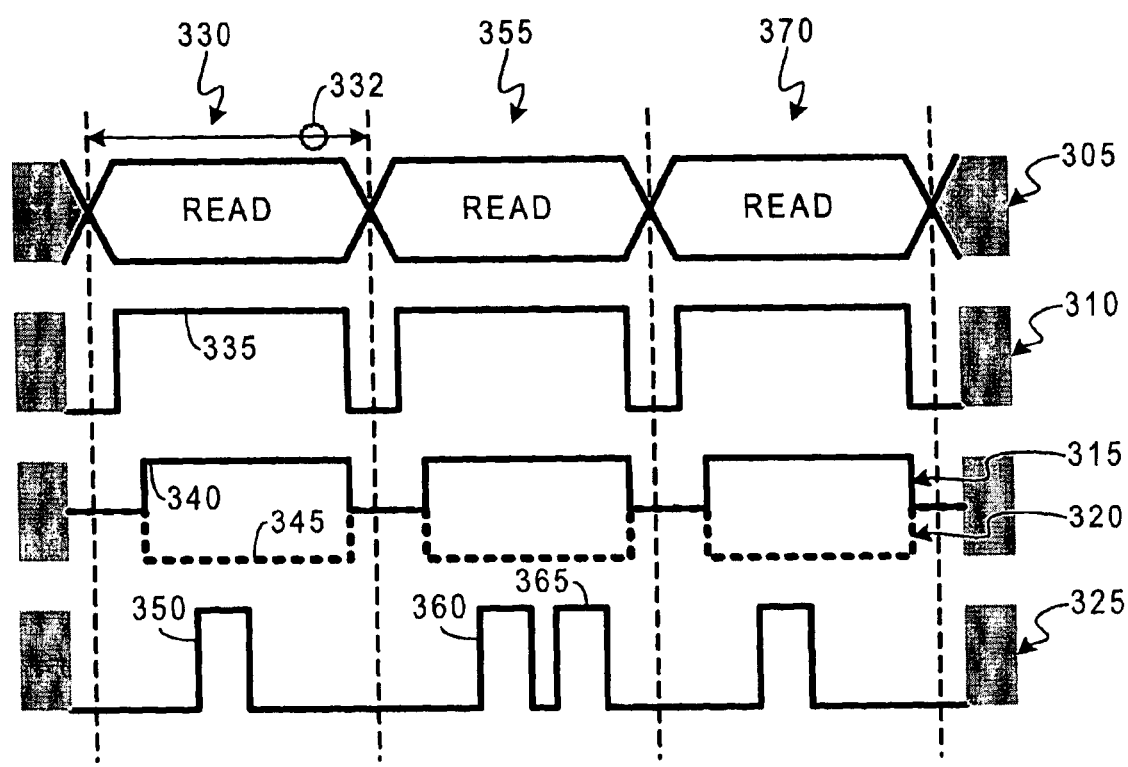
FIG. 3 is a timing diagram of several memory read cycles for a DRAM that makes use of a prior-art technique for error detection and correction.

With reference now to FIG. 3, there is shown a timing diagram illustrating a sequence of modified read cycles from a prior art technique for supporting error detection and correction. FIG. 3 illustrates an exemplary sequence of read cycles for a prior art technique of using memory reads to detect and then correct memory errors. The technique can detect and then correct an error in both locations requiring correction (the read out information and the memory location itself) in a single read cycle.

A first read cycle 330, with a duration displayed as highlight 332, is used to read out information stored in a memory location. As described above, a series of state transitions in various signal lines are used to read out the information, culminating with a column select line (whose signal values are displayed in a timing trace 325) becoming active (displayed as pulse 350) and the information stored in the memory location being read. Once the information stored in the memory location is read from the memory location, error detecting hardware (or possibly software) checks the information for errors. If an error is not detected, then a following memory read cycle (such as a second memory read cycle 355) may be used to read out and error check information from another memory location.

For discussion purposes, assume that an error was detected in the second read cycle 355. Then, the same memory read cycle (the second memory read cycle 355) can be used to correct the detected error. An initial portion of the second memory read cycle 355 (displayed as pulse 360 in the timing trace 325, representing the column select line) may be dedicated to reading information from a memory location, similar to pulse 350 of the first memory read cycle 330. In this case, error detection and correction circuitry detected an error in the information read from the memory location. Additionally, the error detection and correction circuitry may have been able to correct the error in the information. The column select line becomes active for a third time (a third pulse 365). This third pulse 365 can be used to write the corrected information back to the memory location that contained the error, which was detected when the information was read during the second pulse 360.

Note that whether or not there is an error to correct, the memory read cycles (for example, the first memory read cycle 330) needs to be extended a sufficient amount of time in order to provide for the writing of the corrected information back to memory. This extension of the duration of the memory read cycle can slow down the overall performance of the memory, because each memory read now takes a longer amount of time. Therefore, the number of read cycles performed for a given amount of time is now less.

Figure 4:
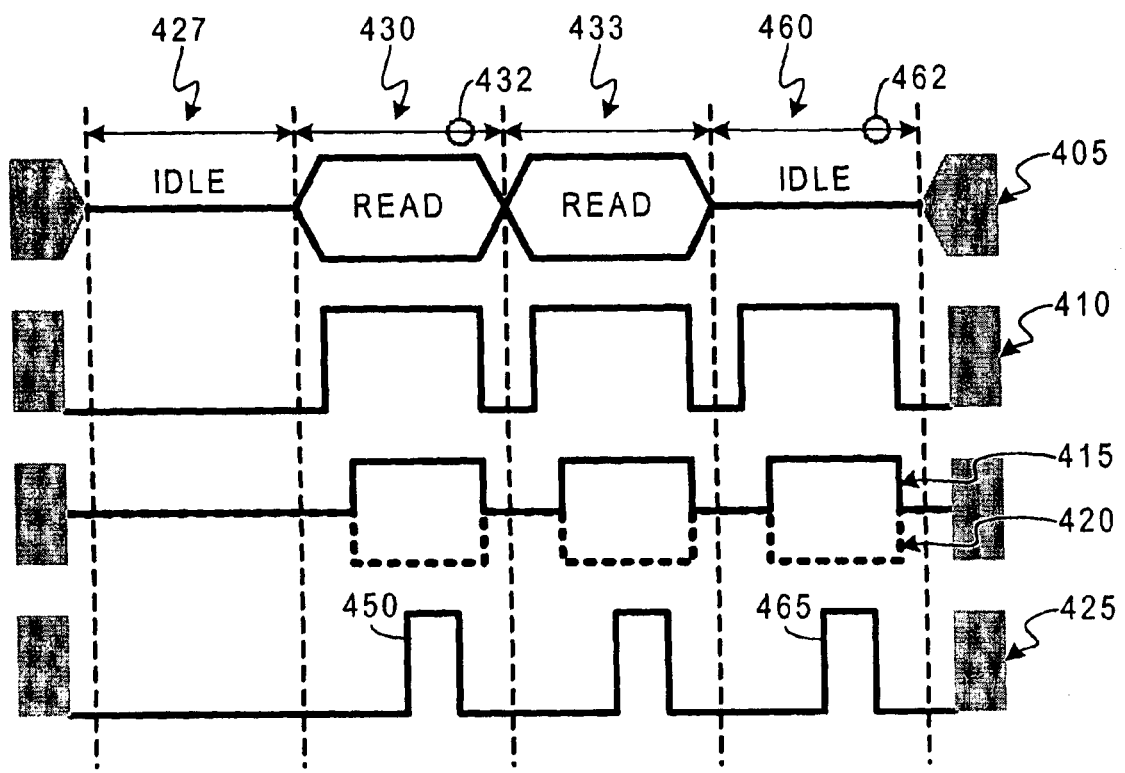
FIG. 4 is a timing diagram of several memory access cycles for a DRAM that makes use of a prior-art technique for error detection and correction.

With reference now to FIG. 4, there is shown a timing diagram illustrating a sequence memory access cycles from a prior art technique of using idle memory access cycles to support error detection and correction FIG. 4 illustrates an exemplary sequence of read cycles and idle cycles used to support a prior art technique of correcting memory errors during idle memory access cycles, wherein the error was previously detected during a read cycle. The technique first detects an error in information read from a memory location and then waits for an idle memory access cycle to correct the error.

In a first memory access cycle 427, the memory is idle and no operation takes place. In a first memory read cycle 430, information is read from a memory location when a column select line (displayed as a fifth curve 425) becomes active (displayed as pulse 450) during the first memory read cycle 430. After the information is read out, it is checked for errors. For discussion purposes, assume that an error is detected. When the error is detected, the memory location associated with the information may be stored in a register or a memory that can be dedicated for such purposes. The information itself, as stored in a data register, may have been corrected immediately by the error detection and correction hardware.

Error detection and correction hardware (or possibly software) will then wait for an idle memory access cycle to become available. An idle memory access cycle is a memory access cycle wherein no operation is being performed on the memory. As illustrated in FIG. 4, an idle memory access cycle 460 becomes available after a second memory read cycle 433. During the idle memory access cycle 460, the stored memory location is retrieved from where it is stored (a register or some memory location) and the appropriate word lines and bit lines are activated (displayed as curves 410, 415, and 420). Finally, the appropriate column select line is activated (displayed as pulse 465) and the corrected information is written back to the memory location.

Although in FIG. 4 the idle memory access cycle 460 becomes available two memory access cycles after the error was detected in memory read cycle 430, it may not be unusual to wait for a large number of memory access cycles before an idle memory access cycle becomes available. Of course, it is also possible for an idle memory access cycle to appear immediately after the read cycle where an error was detected. If a particular block of memory (or any other block of memory) that contains the detected error is continually accessed, an idle memory access cycle may not become available for an extended period of time. If the wait is long, inconsistencies may develop. Inconsistencies such as the memory location that needs to be corrected may be written to or another error is detected prior to the completion of the correcting the present error, for example. Hence possibly negating the need to correct the error. Additionally, errors may accumulate in the faulty memory location thus potentially making it impossible to correct due to too many errors in the information.

Dynamic RAM (DRAM) and other types of dynamic memories require periodic refreshes of each memory element in the memory to prevent loss of information. A refresh operation typically involves the use of a sense amplifier (sense amp) to detect a charge stored in the capacitor in the memory element and replenishes the charge. Each bit in a dynamic memory requires replenishing or information can be lost. Typically, the operation of detecting the charge will also refresh the charge in the capacitor. For example, if due to charge leakage, the charge stored in a capacitor storing a binary one value has dropped down to approximately 75 percent of maximum, the charge detecting operation will reset the charge in the capacitor back to approximately 100 percent of maximum.

The refresh operation is scheduled to occur with sufficient frequency to ensure that every memory element in the memory is refreshed at least once before enough charge leaks out and the information stored within a memory element is lost. For example, depending upon the duration of a memory access cycle and the speed in which charge leaks out of a memory element, a refresh cycle may occur once every few memory access cycles, with a single memory element refreshed per refresh cycle.

Figure 5:
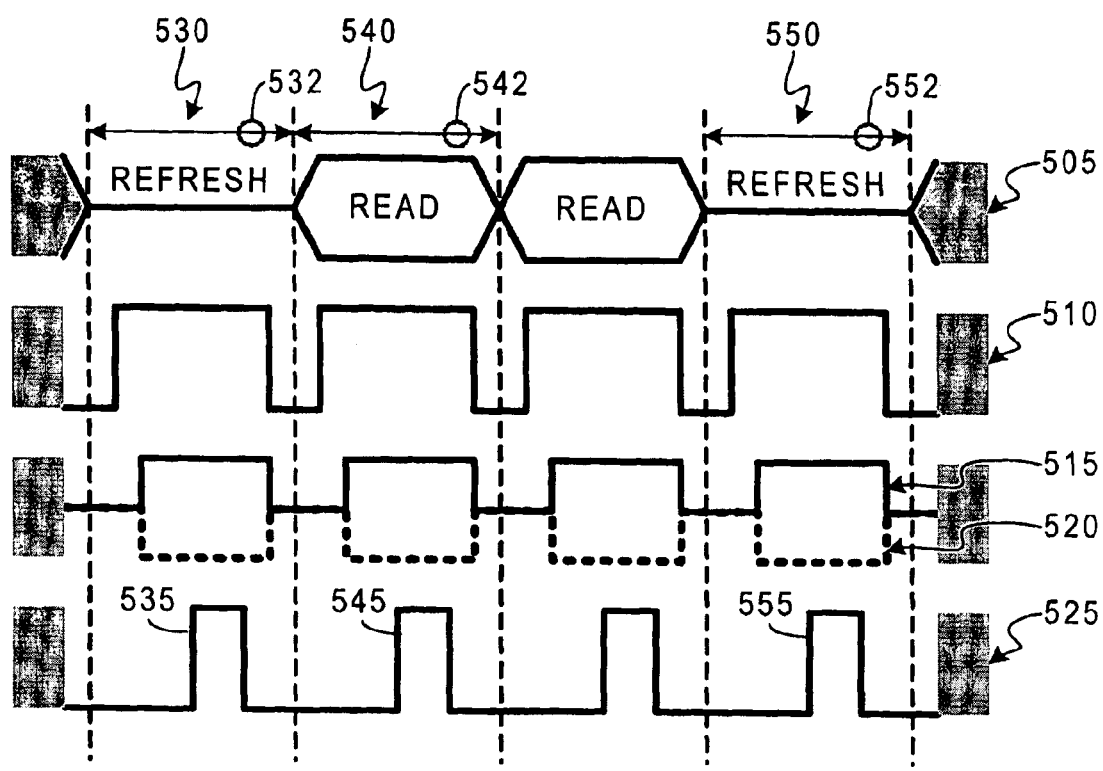
FIG. 5 is a timing diagram of several memory access cycles for a DRAM that makes use of a technique for hiding error detection and correction latency, according to a preferred embodiment of the present invention.

With reference now to FIG. 5, there is shown a timing diagram illustrating a sequence memory access cycles from a technique for supporting error detection and correction using memory refresh cycles, according to a preferred embodiment of the present invention. The sequence of memory access cycles illustrated in FIG. 5 begins with a refresh cycle 530. In a typical refresh cycle, a memory address to be refreshed (normally generated by a refresh memory generator) is used to address a memory element that is to be refreshed. The memory address may be decoded and the appropriate word lines, bit lines, and column select lines associated with the memory address can be activated. Once the appropriate lines are activated, a sense amp can be used to detect (identify) the information stored in the memory element. Normally, the operation of the sense amp will also refresh the charge stored in the memory element. The refreshing of DRAM and other types of dynamic RAM are considered to be well understood by those of ordinary skill in the art of the present invention. Note that the column select line (CSL) is not necessarily activated in conventional refresh operation.

According to a preferred embodiment of the present invention, while the sense amp is identifying and (automatically refreshing) the information in the memory location, the information may also be read out of the memory location. With the information being read out of the memory location, an error detection and correction unit, which may be made from either hardware or software or a combination of the two, can be used to detect if there is an error in the information.

If an error is detected in the information, the address of the memory element can be stored and the refresh operation may be permitted to complete as normal. Once the refresh cycle 530 completes, other memory access cycles (such as a memory read cycle 540 and so forth) are permitted to occur as normal. Then in a second memory refresh cycle 550, a corrected version of the information can be written back to the memory element using the saved address. Once the information is corrected, then a next memory refresh operation can be used to refresh a next memory address.

If an error is not detected in the information, the refresh operation may be permitted to complete as normal. Then in the second memory refresh cycle 550, a next memory address is refreshed. This can be repeated until memory elements in the memory are refreshed and then the refreshing process repeats.

Figure 6:
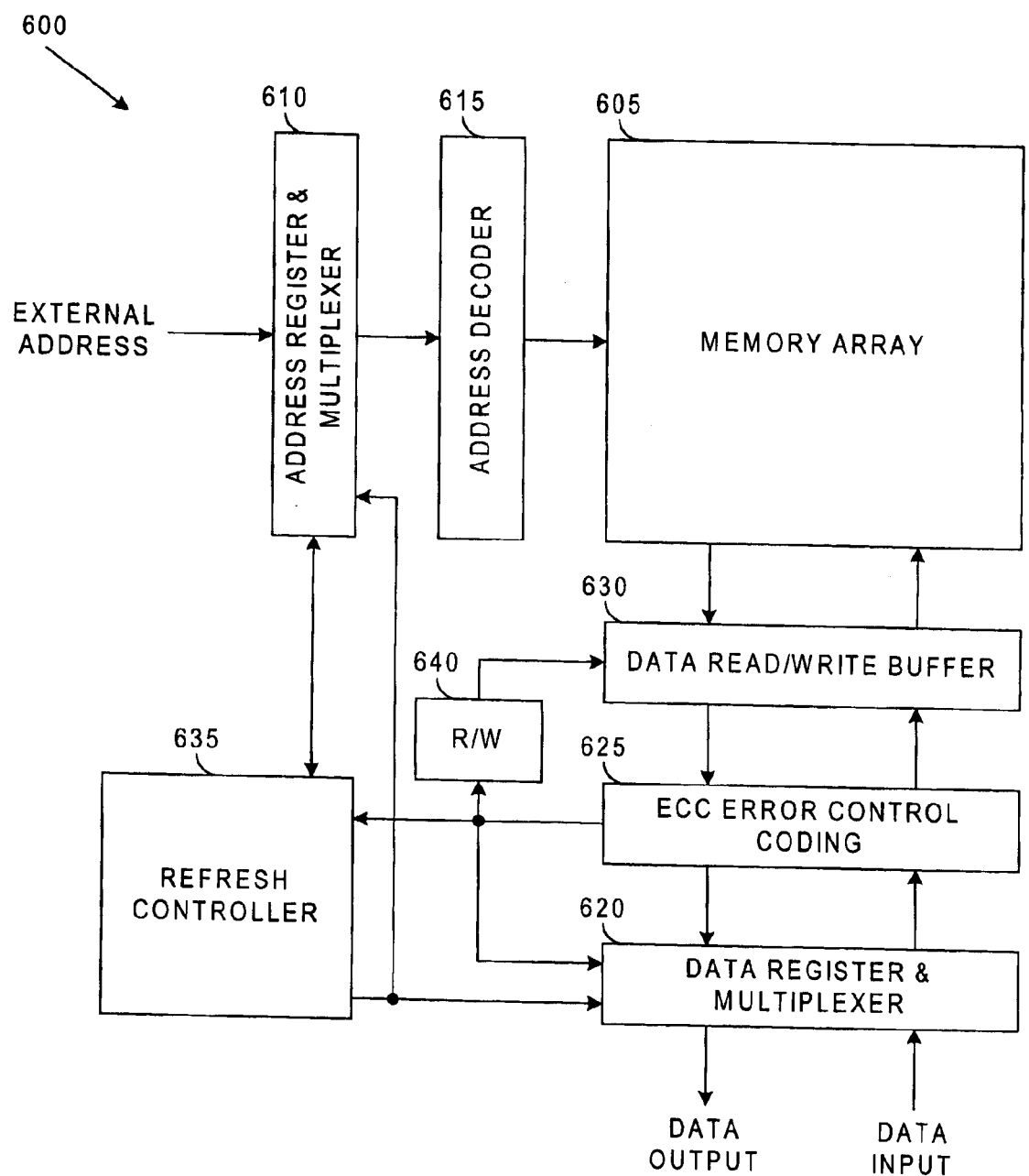
FIG. 6 is a block diagram of a memory system with built-in support for hiding error detection and correction latency, according to a preferred embodiment of the present invention.

With reference now to FIG. 6, there is shown a block diagram illustrating an exemplary architecture of a memory system 600 with built-in error detection and correction wherein latency associated with the error detection and correction is hidden in memory refresh cycles, according to a preferred embodiment of the present invention. The memory system 600 includes a memory array 605 which may contain (a plurality of) memory elements. Regardless of how the memory array 605 is built, it may have the appearance of a single unified block of memory.

Memory elements in the memory array 605 can be addressed by a memory address that can be provided by an external source, such as a computer program that wishes to write to or read from a specified memory location. The memory address may then be provided to an address register and multiplexer 610. The address register and multiplexer 610 can store the address until a requested memory access completes. The memory address, once stored in the address register and multiplexer 610 may then be provided to an address decoder 615. The address decoder 615 decodes the memory address provided into a physical address that may specify word lines, column select lines, memory banks, and so forth. The address decoding may be based on a specific memory map that can differ based on implementation.

After the memory address is decoded in the address decoder 615, the specific bit lines, word lines, column select lines, memory chips, and so forth can be activated to permit the requested memory access to take place.

If the requested memory access is a write operation, the information that is to be written to the memory element can be provided to a data register and multiplexer 620 and a data read/write buffer 630. An error correcting circuit 625 may be used to create an encoding based on the information being written to the memory element. The information can then be written to the memory element once the memory address decoding completes and the required word/column select lines and memory banks are activated.

If the requested memory access is a read operation, after the memory element corresponding to the memory address is activated, the information stored in the memory element is read out. The error correcting circuit 625 may be used to detect if an error has taken place. If no error is detected, the information extracted from the memory element may be stored in the data register and multiplexer 620 where it may be available for use. Note that an error may represent more than one bit error.

In addition to supporting reads from and writes to the memory array, the memory system 600 may provide support for refreshing information stored in the memory array 605. According to a preferred embodiment of the present invention, memory refresh cycles are interspersed throughout the available memory access cycles, with a sufficient number so that each memory element can be refreshed prior to any information is lost due to charge leakage.

Memory refresh operations may be supported by a refresh controller 635. The refresh controller 635 may be responsible for keeping track of the memory locations that have been refreshed and those that need to be refreshed and to generate a memory address for the refresh operation. A commonly used way to generate memory addresses is to use a counter that simply increments (or decrements) its count each time a refresh operation takes place. This can ensure that every memory element is refreshed.

When a memory refresh cycle is to take place, the refresh controller 635 provides a memory address to the address register and multiplexer 610. Rather than taking a memory address from an external source, the address register and multiplexer 610 may elect to take the memory address from the refresh controller 635. The memory address that is provided by the refresh controller 635 may be decoded by the address decoder 615 and used to activate an appropriate set of bit/word/column select lines as well as possibly memory chips and so forth. After a memory element associated with the memory address is activated, sense amps (not shown) may be used to detect the information stored in the memory element and to replenish any charge lost due to leakage.

After providing the memory address, the refresh controller 635 may either increment (or decrement) its count to prepare for the next memory refresh cycle. Alternatively, the refresh controller 635 may be configured to increment (or decrement) its count prior to providing a memory address to the address register and multiplexer 610.

In addition to supporting basic memory operations such as read, write, and refresh, the memory system 600 supports error detection and correction via the error correction circuit 625. However, to minimize the performance impact of error detection and correction, the memory system 600 uses the memory refresh cycle to hide the latency associated with error detection and correction.

According to a preferred embodiment of the present invention, during a memory refresh cycle, when sense amps are used to identify information stored in a memory element, the information stored in the memory element may also be copied into the data read/write buffer 630. Once in the data read/write buffer 630, the error correction circuit 625 can detect if there is an error in the information stored in the memory element. After being processed by the error correction circuit 625, the information may be stored in a data register and multiplexer 620.

If an error is detected, the error correcting circuit 625 can change a value of a register referred to as a read/write (R/W) mode register 640. According to a preferred embodiment of the present invention, the R/W mode register 640 may be a single bit register or memory value, which when an error has not been detected, i.e., normal operations, may assume the value of read (R). When the R/W register mode 640 has the value of (R), then during a memory refresh cycle the information stored in a memory element associated with the memory address contained in the refresh controller 635 may be refreshed. However, when an error has been detected, the R/W mode register 640 may be set to contain the value of write (W).

The error correcting circuit 625 may also use its error correcting circuitry in conjunction with the information retrieved from the memory element to correct the error. As stated previously, the information retrieved from the memory element may contain both a message (the data itself) portion and a checking portion. The checking portion may contain bits of information that can be used in conjunction with the message portion to detect and correct bit errors present in either the message or the checking portion. According to a preferred embodiment of the present invention, the corrected information may be stored in the data register 620 to ensure that the corrected information may not be overwritten by future memory reads and/or writes while waiting for a next memory refresh cycle to arrive, which may be several memory access cycles away. Alternatively, the corrected information may be provided to the data read/write buffer 630 to be written back to the memory element.

In addition to setting the value of the R/W mode register 640 and correcting the information containing the error and writing the corrected information to the data read/write buffer 630, the error correction circuit 625 may also communicate to the refresh controller 625. According to a preferred embodiment of the present invention, the refresh controller 625, upon being notified that an error has been detected, may elect to not increment (or decrement) its memory address counter. A reason for not changing its count may be to ensure that the memory address stored in the refresh controller 625 remains the memory address of the memory element containing the error.

Additionally, the error correction circuit 625 may also communicate to the data register and multiplexer 620. The corrected information may be written to the data register and multiplexer 620.

With the R/W mode register 640 containing a (W) value, at a first subsequent memory refresh operation, rather than decoding the memory address provided by the refresh controller 635 and refreshing a memory element associated with the memory address, the memory system 600 decodes the memory address provided by the refresh controller (which can be the memory address that contains the information with the detected error) and then writes the corrected information back to a memory element associated with the memory address. This corrects the second of the two places where the erroneous information may be located.

Since in many implementations of memory systems, memory refresh cycles do not occur in succession (one after another), there is a possibility that a memory element containing the erroneous information may be written to prior to the corrected information being written back to the memory element. Therefore, if the corrected information (now invalid) is written back to the memory element, it would overwrite the information in the memory element with invalid information. According to a preferred embodiment of the present invention, the refresh controller 635 monitors writes to memory elements in the memory array 605 and if a memory write coincides with a memory address that contained erroneous information that is to be overwritten with corrected information, the refresh controller 635 can cancel the writing back of the corrected information. The canceling of the writing back of the corrected information may be accomplished by setting the contents of the R/W mode register 640 to a (R) value and to increment (or decrement) the memory address counter.

Figure 7:
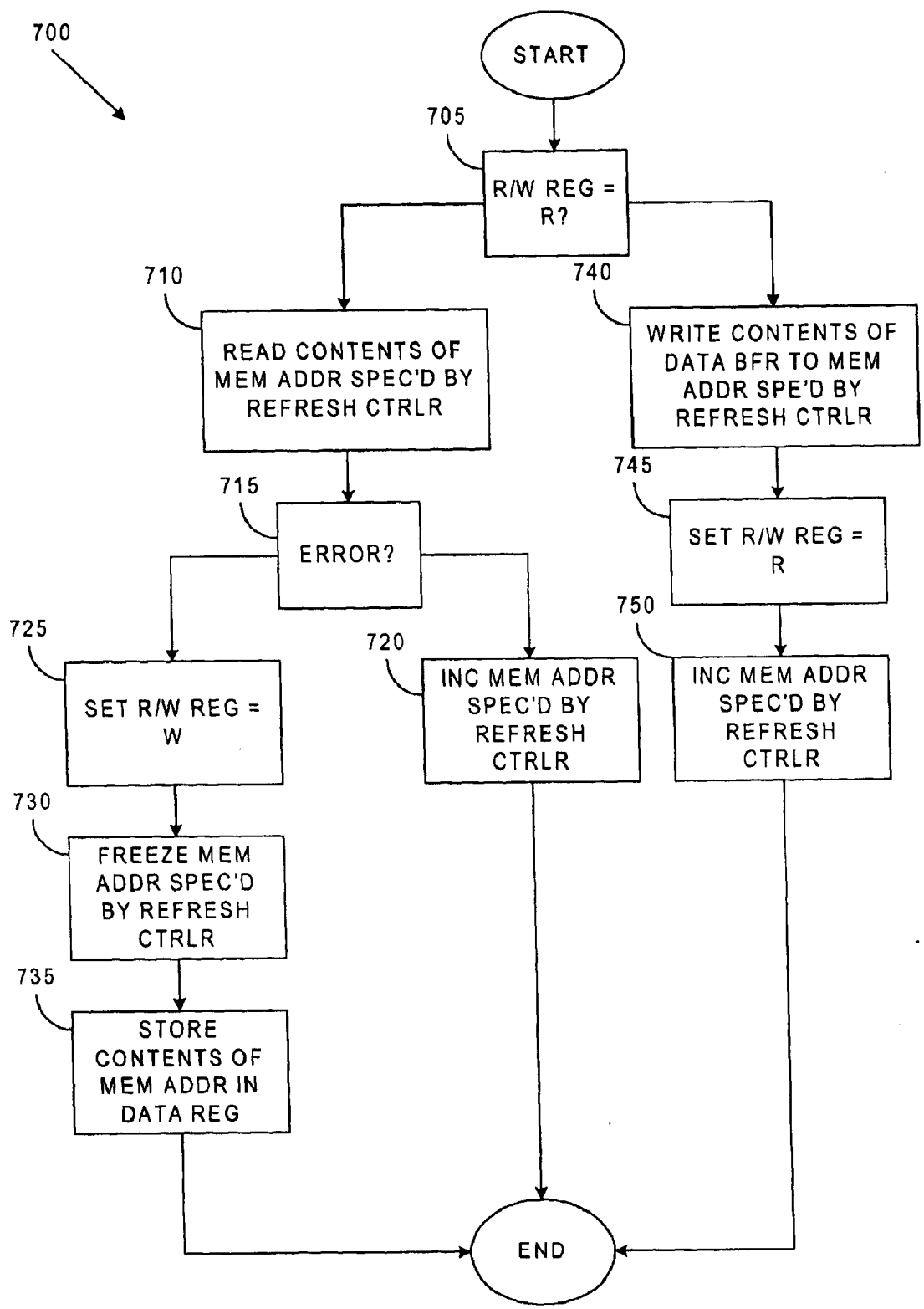
FIG. 7 is a flow diagram of a process for hiding error detection and correction latency, according to a preferred embodiment of the present invention.

With reference now to FIG. 7, there is shown a flow diagram illustrating a process 700 for the use of a memory refresh cycle for hiding error detection and correction, according to a preferred embodiment of the present invention. According to a preferred embodiment of the present invention, the process 700 may be used by a memory system (for example, memory system 600 (FIG. 6)) to hide latency associated with error detection and correction within a memory refresh cycle.

The process 700 begins when the memory system 600 begins a memory refresh cycle. According to a preferred embodiment of the present invention, the content of the R/W mode register (R/W mode register 640 (FIG. 6)) may be checked (block 705). If the R/W mode register 640 contains a (R), then the memory system 600 should proceed with a normal memory refresh cycle. The memory system 600 continues by refreshing the contents of a memory element associated with a memory address specified by a refresh controller (for example, refresh controller 635 (FIG. 6)) in block 710. As discussed earlier, the refreshing includes reading the information stored in the memory element and performing an error detect on the information. If an error is not detected (block 715), then the refresh controller 635 increments (or decrements) its memory address counter and the memory refresh cycle completes.

However, if an error is detected by an error correcting circuit (for example, error correcting circuit 625 (FIG. 6)), then the error correcting circuit 625 may set the R/W mode register 640 to (W) (block 725), notify the refresh controller 635 that it should not increment (or decrement) its memory address counter (block 730), correct the erroneous information, and perhaps store the corrected information in a data register and multiplexer (for example, data register and multiplexer 620 (FIG. 6)) in block 735.

The process 700 then waits until a subsequent memory refresh cycle arrives. With the arrival of the new memory refresh cycle, the memory system 600 begins in a similar fashion as in the previous memory refresh cycle by checking the contents of the R/W mode register 640 (block 705). Since in the previous memory refresh cycle, the R/W mode register 640 was set to (W) (block 725), the memory system 600 may write the corrected information that may be stored in the data read/write buffer 630 (or the data register and multiplexer 620) to a memory element associated with the memory address in the refresh controller 635 (block 740). Since the memory address counter in the refresh controller 635 was not incremented (or decremented) in the previous memory refresh cycle, the corrected information may be written back to the memory element that held the erroneous information.

After writing the corrected information back to the memory element in block 740, the contents of the R/W mode register 640 may then be reset to (R) (block 745) and the memory address counter can be incremented (or decremented) in block 750 and the memory refresh cycle completes.

Note that in the time between the memory refresh cycle wherein the error was detected and the subsequent memory refresh cycle wherein the error was corrected, the memory system 600 keeps track of writes to memory to determine if other information is written to the memory element containing the erroneous information. If this is the case, the corrected information write back should be cancelled. This may be achieved by incrementing (or decrementing) the memory address counter and setting the R/W mode register 640 to (R).

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of the matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for hiding error detecting and correcting latency comprising:
   in a first memory refresh cycle, determining if an error exists in information stored in a memory element being refreshed; and
   in a second memory refresh cycle, writing collected information to the memory element when the information contains an error.

2. The method of claim 1, wherein the error is a single bit error.

3. The method of claim 1, wherein the error is a multiple bit error.

4. The method of claim 1, wherein the second memory refresh cycle is a memory refresh cycle immediately following the first memory refresh cycle.

5. The method of claim 4, wherein there are memory access cycles between the first and the second memory refresh cycles.

6. The method of claim 1, wherein the determining comprises:
   sensing the information stored in the memory element; and using the information to determine the existence of the error.

7. The method of claim 1, further comprising in the first memory refresh cycle:
   correcting the error in the information if the error is detected; and
   setting a control value to a specified value if the error is detected.

8. The method of claim 7, wherein the writing comprises if the control value is equal to the specified value, writing the corrected information to the memory element.

9. The method of claim 8, wherein the writing further comprises setting the control value to a second specified value.

10. The method of claim 8, further comprising in the second memory refresh cycle refreshing information in a second memory element if the control value is different from the specified value.

11. The method of claim 7, wherein the control value is a flag.

12. A memory system comprising:
   a memory array containing a plurality of memory elements;
   an error correcting circuit coupled to the memory array, the error correcting circuit configured to detect errors in information stored in the memory array in a first memory refresh cycle and write corrected information related to the detected errors back to the memory array in a second memory refresh cycle;
   a refresh controller coupled to the error correcting circuit, the refresh controller containing circuitry to generate memory addresses for memory refresh cycles; and
   a read/write mode register coupled to the error correcting circuit, the read/write register specifying an operating mode of the memory system.

13. The memory system of claim 12, wherein the read/write mode register specifies a read/write mode of the memory system when the memory system is performing a memory refresh operation.

14. The memory system of claim 12 further comprising a data register coupled to the error correcting circuit, the data register to hold corrected information provided by the error correcting circuit.

15. The memory system of claim 12, wherein the refresh controller uses a counter to generate memory addresses for memory refresh cycles.

16. The memory system of claim 15, wherein when an error is detected by the error correcting circuit, the refresh controller freezes the memory address used in the memory refresh cycle.

17. The memory system of claim 15, wherein when the memory refresh cycle completes without detecting an error in the information, the refresh controller updates the counter.

18. A method of hiding error detecting and correcting latency in a memory comprising:
   in a first memory refresh cycle,
      sensing information stored in a memory element;
      determining if the information contains errors;
      setting a control value to a specified value if the information contains errors;
      correcting the information;
   in a second memory refresh cycle,
      writing the corrected information back to the memory element if the control value is equal to the specified value; and
      performing the sensing, determining, setting, and correcting if the control value is different from the specified value.

19. The method of claim 18, wherein the first and second memory refresh cycles are consecutive memory refresh cycles.

20. The method of claim 19, wherein there are memory access cycles in between the first and the second memory refresh cycles.

21. The method of claim 18, further comprising in the second memory refresh cycle, setting the control value to a second specified value.

22. The method of claim 18, wherein the memory is a dynamic memory.

23. The method of claim 18, wherein the memory is a dynamic random access memory.

* * * * *